US012677451B2

(12) United States Patent
Mehta et al.

(10) Patent No.: US 12,677,451 B2
(45) Date of Patent: Jul. 7, 2026

(54) BOTTOM DIELECTRIC ISOLATION FOR VERTICALLY STACKED DEVICES

(71) Applicant: INTERNATIONAL BUSINESS MACHINES CORPORATION, Armonk, NY (US)

(72) Inventors: Sanjay C. Mehta, San Jose, CA (US); Shogo Mochizuki, Mechanicville, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 807 days.

(21) Appl. No.: 17/655,797

(22) Filed: Mar. 22, 2022

(65) Prior Publication Data

US 2023/0307495 A1 Sep. 28, 2023

(51) Int. Cl.
| | |
|---|---|
| *H10D 62/10* | (2025.01) |
| *H10D 30/67* | (2025.01) |
| *H10D 84/01* | (2026.01) |
| *H10D 84/03* | (2025.01) |
| *H10W 10/00* | (2026.01) |
| *H10W 10/10* | (2026.01) |

(52) U.S. Cl.
CPC ....... *H10D 62/115* (2025.01); *H10D 30/6713* (2025.01); *H10D 30/6735* (2025.01); *H10D 30/6757* (2025.01); *H10D 62/118* (2025.01); *H10D 62/121* (2025.01); *H10D 84/0128* (2025.01); *H10D 84/013* (2025.01); *H10D 84/038* (2025.01); *H10W 10/011* (2026.01); *H10W 10/10* (2026.01)

(58) Field of Classification Search
None
See application file for complete search history.

(56) References Cited

U.S. PATENT DOCUMENTS

| | | | |
|---|---|---|---|
| 9,378,975 | B2 | 6/2016 | Parkinson |
| 9,704,962 | B1 | 7/2017 | Pawlak |
| 10,032,867 | B1 | 7/2018 | Yeung |
| 10,192,867 | B1 | 1/2019 | Frougier |
| 10,629,702 | B2 | 4/2020 | Bi |
| 10,840,329 | B1 | 11/2020 | Xie |
| 10,937,860 | B2 | 3/2021 | Bi |

(Continued)

*Primary Examiner* — Julio J Maldonado
*Assistant Examiner* — Pinaki Das
(74) *Attorney, Agent, or Firm* — Kristofer Haggerty

(57) ABSTRACT

A first and a second nanosheet stack, a shallow trench isolation region vertically aligned between them, a continuous dielectric layer below the first and second nanosheet stack and above the shallow trench isolation region. The shallow trench isolation region is vertically aligned with a source drain between the first and the second nanosheet stack. A method including forming a first and a second nanosheet stack on a first substrate, the first and the second nanosheet stack each including a lower nanosheet stack vertically aligned above an upper nanosheet stack, the upper nanosheet stack and the lower nanosheet stack each including alternating layers of a sacrificial material and a semiconductor channel material vertically aligned and stacked one on top of another, flipping the first substrate over, bonding an upper surface of the first substrate to an upper surface of a second substrate which includes a shallow trench isolation region.

11 Claims, 19 Drawing Sheets

Section E-E

(56)                    References Cited

U.S. PATENT DOCUMENTS

| 11,062,937 | B2 | | 7/2021 | Cheng | |
|---|---|---|---|---|---|
| 2020/0365584 | A1 | * | 11/2020 | Ando | H10D 62/83 |
| 2021/0057550 | A1 | * | 2/2021 | Cheng | H10D 30/024 |
| 2021/0210349 | A1 | * | 7/2021 | Xie | H10D 84/0151 |
| 2022/0208965 | A1 | * | 6/2022 | Min | H10D 84/834 |

* cited by examiner

100

100

| 114 |
|-----|
| 108 |
| 110 |
| 108 |
| 110 |
| 108 |
| 112 |
| 108 |
| 110 |
| 108 |
| 110 |
| 108 |
| 102 |

Figure 2
Section A-A

200

Section C-C

200

208          208

206
204

214          214
212          212

202

Section C-C

Section C-C

200

206

204

216
214

212

202

216
214

212

Section C-C

200

220
206
204

216
214
212

202

216
214
212

Section C-C

300

100

| 102 |
| 108 |
| 110 |
| 108 |
| 110 |
| 108 |
| 112 |
| 108 |
| 110 |
| 108 |
| 110 |
| 108 |
| 114 |

220
206
204

200

216
214
212

216
214
212

202

Section E-E

300

100

| 102 |
| 108 |
| 110 |
| 108 |
| 110 |
| 108 |
| 112 |
| 108 |
| 110 |
| 108 |
| 110 |
| 108 |
| 114 |

220
206
204

200

216
214

212

216
214

212

202

Section E-E

300

304

302

102

108

110

108

110

108

112

108

110

108

110

108

114

220
206
204

216
214
212

216
214
212

202

Section E-E

Section E-E

Section E-E

300

Section E-E

Section E-E

300

E

332

314
312
102

346    342    346    342    346

340    340    340

110    110    110

340    336    340    336    340

110    110    110

340    340    340

330    335    330    335    330

338    338    338

110    334    110    334    110

338    338    338

110    110    110

338    338    338

332

114
220
206
204

202

E

Section D-D

BOTTOM DIELECTRIC ISOLATION FOR VERTICALLY STACKED DEVICES

BACKGROUND

The present invention relates, generally, to the field of semiconductor manufacturing, and more particularly to bottom isolation between vertically stacked nanosheet field effect transistors.

Complementary Metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. As demands to reduce the dimensions of transistor devices continue, nanosheet FETs help achieve a reduced FET device footprint while maintaining FET device performance. A nanosheet device contains one or more layers of semiconductor channel material portions having a vertical thickness that is substantially less than its width. A nanosheet FET includes a plurality of stacked nanosheets extending between a pair of source/drain epitaxial regions. The device may be a gate all around device or transistor in which a gate surrounds a portion of the nanosheet channel.

SUMMARY

According to an embodiment, a semiconductor device is provided. The semiconductor including a first nanosheet stack and a second nanosheet stack on a substrate, a shallow trench isolation region in the substrate, the shallow trench isolation region vertically aligned between the first nanosheet stack and the second nanosheet stack and a continuous dielectric layer below the first nanosheet stack, below the second nanosheet stack and above the shallow trench isolation region.

According to an embodiment, a semiconductor device is provided. The semiconductor including a first nanosheet stack and a second nanosheet stack on a substrate, a shallow trench isolation region in the substrate, the shallow trench isolation region vertically aligned between the first nanosheet stack and the second nanosheet stack and a continuous dielectric layer below the first nanosheet stack, below the second nanosheet stack and above the shallow trench isolation region, where the shallow trench isolation region is vertically aligned with a source drain between the first nanosheet stack and the second nanosheet stack.

According to an embodiment, a method is provided. The method including forming a first nanosheet stack and a second nanosheet stack on a first substrate, the first nanosheet stack and the second nanosheet stack each including a lower nanosheet stack vertically aligned above an upper nanosheet stack, the upper nanosheet stack and the lower nanosheet stack of both the first nanosheet stack and the second nanosheet stack, each including alternating layers of a sacrificial material and a semiconductor channel material vertically aligned and stacked one on top of another, flipping the first substrate over, and bonding an upper surface of the first substrate to an upper surface of a second substrate, where the second substrate includes a shallow trench isolation region.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIG. 2 illustrates a cross-sectional view of the first semiconductor structure of FIG. 1 along section line A-A, according to an exemplary embodiment;

Figure 1:
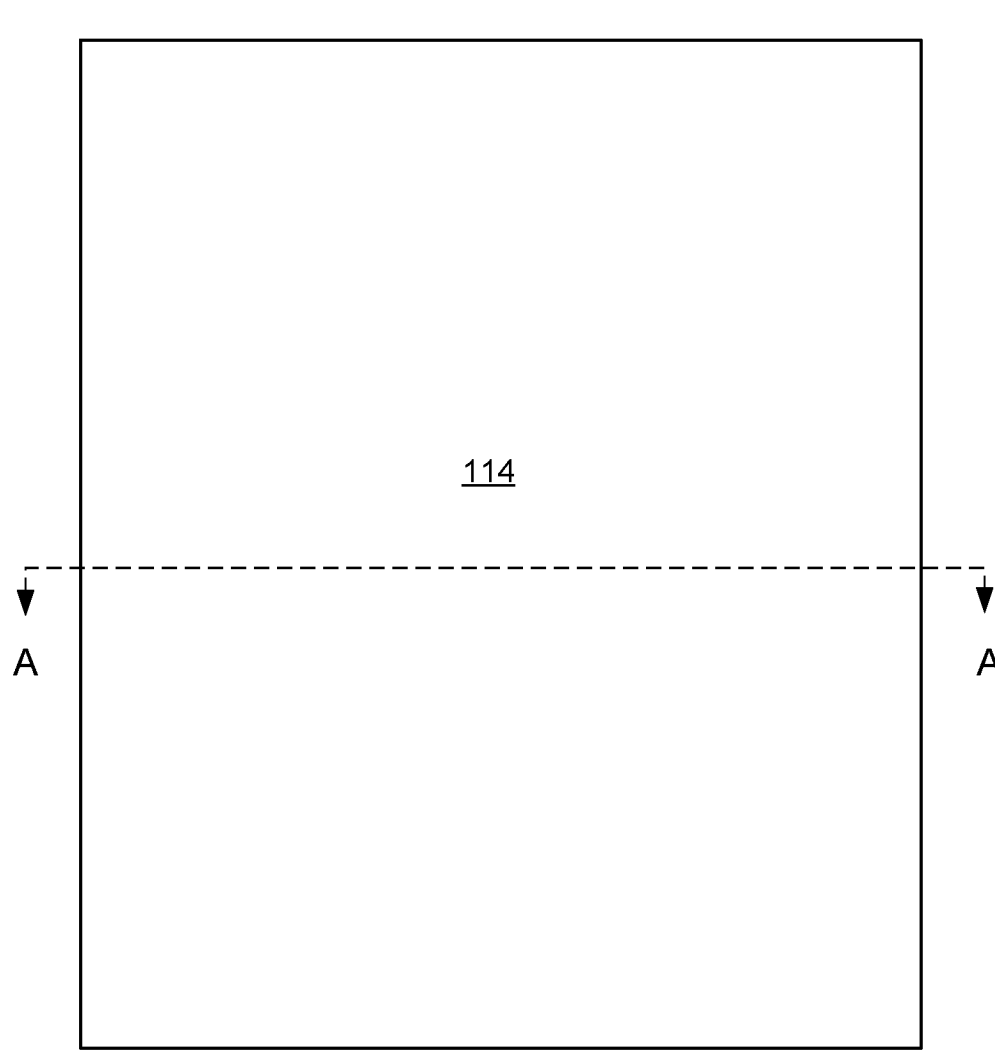
FIG. 1 illustrates a top view of a first semiconductor structure at an intermediate stage of fabrication, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

A nanosheet field effect transistor (hereinafter "FET") may be formed from alternating layers of silicon and silicon germanium, which are then formed into stacked nanosheets. A gate all around structure may be formed on all vertical sides and on a horizontal top surface of a section of the nanosheets. Source-drain structures may be formed at the opposite ends of the stacked nanosheet structures.

Stacking two nanosheet FETs, with an isolation layer between them, is an approach for increasing density of semiconductors. The stacked nanosheet FET may include a negative channel FET (hereinafter "n-FET"), stacked on top of a positive channel FET (hereinafter "p-FET"), or the p-FET stacked on top of the n-FET. Alternatively, two n-FETs may be stacked on top of each other, or two p-FETs, may be stacked on top of each other.

Robust bottom isolation between adjacent stacked FETs is necessary for proper functioning of the FETs, to both electrically and physically isolate the adjacent stacked nanosheets and FETs from each other.

Formation of a shallow trench isolation region (hereinafter "STI") may be done after forming the layers of the stacked nanosheet. Layers of the stacked nanosheet are formed, trenches are formed parallel to each other in the layers of the stacked nanosheet and sacrificial gates are then formed perpendicular to the trenches. Additional trenches are formed between sacrificial gates and shallow trench isolation regions (hereinafter "STI") are formed embedded in the additional trenches. Outer portions of sacrificial layers of the stacked nanosheets may be removed and inner spacers formed where the outer portions of the sacrificial layers of the stacked nanosheets where removed. Source drain regions are formed above the STIs extending out from exposed channel layers of the nanosheet stacks. The sacrificial gates are removed, and remaining portions of the sacrificial layers are removed. Work function metal may be formed where the remaining portions of the sacrificial layers were removed, surrounding the channel layers. Contacts may be formed to the work function metal and to the source drain.

Several process steps are required to form the STI, requiring the layers of the stacked nanosheet to be subject to these processing steps. It may be preferable to form the STI separately from forming the layers of the stacked nanosheet.

This inventive solution to forming the stacked nanosheets on a first substrate, forming the STI on a second substrate and bonding the first and second substrates together. Additional processing steps starting with a sacrificial gate formation may be performed on the combined substrate. Forming the STI on the second substrate may allow for a larger and improved thick insulator material to help isolate electrically and physically adjacent nanosheet devices and isolation reduces leakage characteristics between adjacent nanosheet devices.

There are several advantages to formation of a thick insulator material on the second substrate which then becomes an STI between adjacent nanosheet devices, including simplifying downstream flow of several processing steps, by eliminating a need for an STI recess after forming nanosheet stacks, by joining a second substrate to a first substrate containing formed nanosheet stacks, where the second substrate has STI formed.

When forming the STI between adjacent nanosheet devices, an aspect ratio (AR) for an STI gap is high due to a height of the nanosheet stack with multiple layers. A high AR is not preferable for STI trench and gap fill. A lower AR is preferable due to improved uniformity of densification. Uniform densification can be achieved with lower AR and high thermal budget. A formation of the STI separately allows for a larger STI which will help lower the AR.

Formation of a thick insulator material between adjacent nanosheet devices removes STI thermal budget constraint imposed by Ge out-diffusion concerns. When forming the STI between adjacent nanosheet devices, an STI anneal is performed with a presence of high germanium sacrificial SiGe layer (for example 70% Ge SiGe). The STI anneal can damage the high germanium sacrificial SiGe layer and a high thermal budget required for STI densification will result in a diffusion of germanium out of the high germanium SiGe layer. In this invention, the high thermal budget (for STI densification) will be performed on second substrate which does not have SiGe layers.

Formation of a thick insulator material between adjacent nanosheet devices provides lower AR that reduces complexity associated with STI gap fill and uniform densification.

The present invention relates, generally, to the field of semiconductor manufacturing, and more particularly to bottom isolation between vertically stacked nanosheet field effect transistors.

Embodiments of the present invention disclose a structure and a method of forming a double stacked FET nanosheet with robust isolation between the adjacent FET nanosheets are described in detail below by referring to the accompanying drawings in FIGS. 1-20, in accordance with an illustrative embodiment.

Referring now to FIGS. 1 and 2, a semiconductor structure 100 (hereinafter "structure") at an intermediate stage of fabrication is shown according to an exemplary embodiment. FIG. 1 is a top view of the structure 100. FIG. 2 is a cross-sectional view of the structure 100 along section line A-A. The structure 100 of FIG. 1 may be formed or provided.

The structure 100 may include alternating layers of sacrificial semiconductor material and semiconductor channel material stacked one on top of another and a dielectric capping layer 114 on a substrate 102. It should be noted that, while a limited number of alternating layers are depicted, any number of alternating layers may be formed.

The substrate 102 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate 102 may be approximately, but is not limited to, several hundred microns thick. In other embodiments, the substrate 102 may be a layered semiconductor such as a silicon-on-insulator or SiGe-on-insulator, where a buried insulator layer, separates a base substrate from a top semiconductor layer. In an embodiment, the substrate 102 may be 0.75 mm thick.

The alternating layers of sacrificial semiconductor material and semiconductor channel material may include a sacrificial semiconductor material layer 108 (hereinafter "sacrificial layer"), covered by a semiconductor channel material layer 110 (hereinafter "channel layer"), covered by a sacrificial layer 108, covered by a channel layer 110, covered by a sacrificial layer 108, covered by a stack sacrificial layer 112, covered by a sacrificial layer 108, covered by a channel layer 110, covered by a sacrificial layer 108, covered by a channel layer 110, covered by a sacrificial layer 108.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition technique, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth techniques include, for example, rapid thermal chemical vapor deposition (RT-CVD), low-energy plasma deposition (LEPD), ultra-high vacuum chemical vapor deposition (UHVCVD), low pressure chemical vapor deposition (LPCVD), atmospheric pressure chemical vapor deposition (APCVD) and molecular beam epitaxy (MBE). The temperature for epitaxial deposition typically ranges from approximately 550° C. to approximately 900° C. Although higher temperature typically results in faster deposition, the faster deposition may result in crystal defects and film cracking. The epitaxial growth the first and second semiconductor materials that provide the sacrificial semiconductor material layers and the semiconductor channel material layers, respectively, can be performed utilizing any well-known precursor gas or gas mixture. Carrier gases like hydrogen, nitrogen, helium and argon can be used.

Each sacrificial layer 108 is composed of a first semiconductor material which differs in composition from at least an upper portion of the substrate 102, the channel layer 110 and the stack sacrificial layer 112. In an embodiment, each sacrificial layer 108 may be a silicon-germanium semiconductor alloy and have a germanium concentration less than 50 atomic percent. In another example, each sacrificial layer 108 may have a germanium concentration ranging from about 20 atomic percent to about 40 atomic percent. Each sacrificial layer 108 can be formed using known deposition techniques or an epitaxial growth technique as described above.

Each channel layer 110 is composed of a second semiconductor material which differs in composition from at least the upper portion of the substrate 102, the sacrificial layer 108 and the stack sacrificial layer 112. Each channel layer 110 has a different etch rate than the first semiconductor material of sacrificial layer 108 and has a different etch rate than the stack sacrificial layer 112. The second semiconductor material can be, for example, silicon. The second semiconductor material, for each channel layer 110 can be formed using known deposition techniques or an epitaxial growth technique as described above.

The stack sacrificial layer 112, may, for example, be silicon germanium with a germanium concentration about 70 atomic percent, although percentages greater than 70 percent and less than 70 percent may be used. The stack sacrificial layer 112 can each be formed using an epitaxial growth technique. The stack sacrificial layer 112 will each subsequently be removed selective to the remaining alternating layers, as described below.

The alternating layers of sacrificial layer 108, channel layer 110 and stack sacrificial layer 112 can be formed by sequential epitaxial growth of alternating layers of the first semiconductor material, the second semiconductor material and the nanosheet stack sacrificial layer material.

The sacrificial layers 108 may have a thickness ranging from about 5 nm to about 15 nm, and the channel layers 110 may have a thickness ranging from about 3 nm to about 12 nm. Each sacrificial layer 108 may have a thickness that is the same as, or different from, a thickness of each channel layer 110. In an embodiment, each sacrificial layer 108 has an identical thickness. In an embodiment, each channel layer 110 has an identical thickness. The stack sacrificial layer 112 may each have a thickness ranging from about 5 nm to about 40 nm.

The dielectric capping layer 114 is deposited on the nanosheet stack over the uppermost sacrificial layer 108. The dielectric capping layer 114 may also be referred to as an oxide layer. Non-limiting examples of materials for the dielectric capping layer 114 may include tetraethylorthosilicate (TEOS) oxide, silicon dioxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The dielectric capping layer 114 may have a thickness in a range from about 10 nm to about 200 nm, or from about 20 nm to about 100 nm.

A chemical mechanical polishing (CMP) technique may be used to remove excess material and polish an upper surface of the structure 100, removing portions of the dielectric capping layer 114. A chemical mechanical polishing (CMP) technique may be used to remove excess material and polish a lower surface of the structure 100, removing portions of the substrate 102. In an embodiment, 0.7 mm may be removed from the lower surface of the substrate 102. Removal of portions of the substrate 102 may be performed after bonding the structure 100 with a structure described in the following figures.

Figure 3:
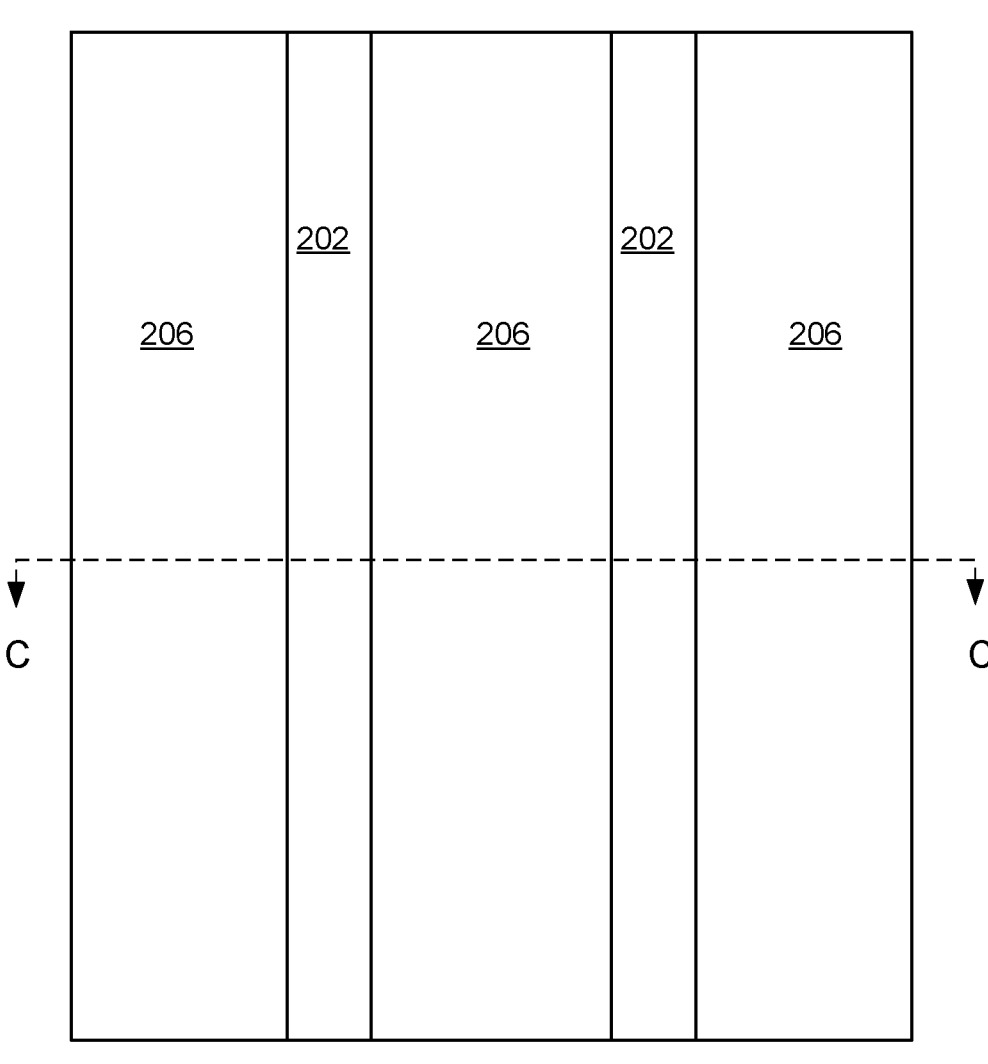
FIG. 3 illustrates a top view of a second semiconductor structure at an intermediate stage of fabrication, according to an exemplary embodiment.
Figure 4:
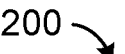
FIG. 4 illustrates a cross-sectional view of the second semiconductor structure of FIG. 3 along section line C-C, according to an exemplary embodiment.
Figure 4:
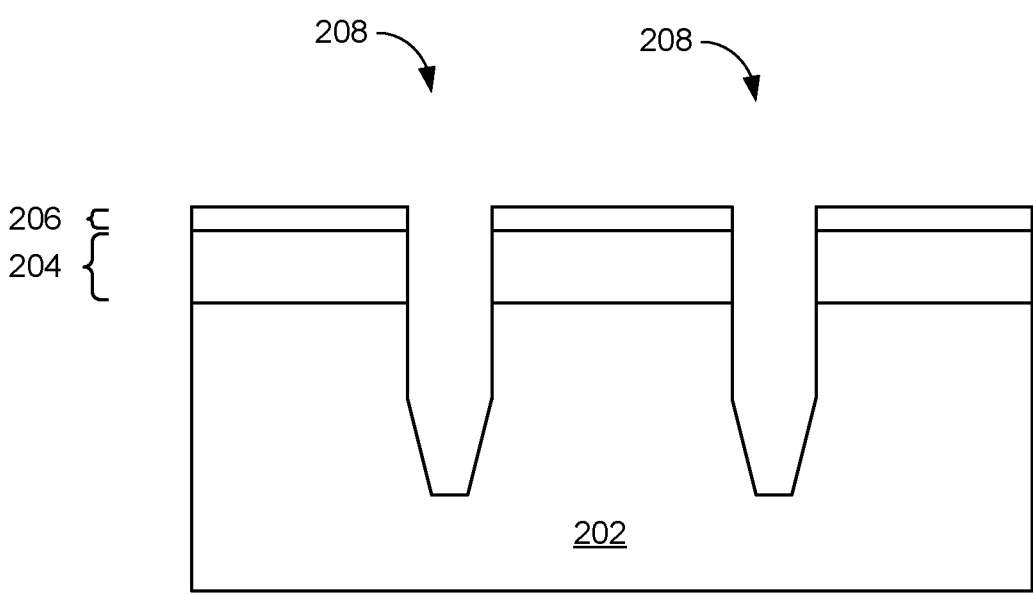

Referring now to FIGS. 3 and 4, a semiconductor structure 200 (hereinafter "structure") at an intermediate stage of fabrication is shown according to an exemplary embodiment. FIG. 3 is a top view of the structure 200. FIG. 4 is a cross-sectional view of the structure 200 along section line C-C. The structure 200 may be formed or provided.

The structure 200 may include an insulator 204 and a liner 206 on a substrate 202. The structure 200 may include a trench 208.

The substrate 202 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate 202 may be approximately, but is not limited to, several hundred microns thick. In other embodiments, the substrate 202 may be a layered semiconductor such as a silicon-on-insulator or SiGe-on-insulator, where a buried insulator layer, separates a base substrate from a top semiconductor layer. In an embodiment, the substrate 202 may be 300 mm thick.

The insulator 204 may be formed conformally on the substrate 202. The insulator 204 may include any dielectric material such as oxide, silicon nitride (SiN), silicon boron carbon nitride (SiBCN), silicon oxide carbon nitride (SiOCN), aluminum oxide (AlOx), and may include a single layer or may include multiple layers of dielectric material. The insulator 204 can be formed using any deposition technique including, for example, thermal oxidation, wet anodization, chemical vapor deposition (CVD), physical vapor deposition (PVD) and oxidation techniques. The insulator 204 may have a thickness ranging from about 5 nm to about 20 nm.

The liner 206 may be formed conformally on the insulator 204. The liner 206 may be formed by, for example, low pressure chemical vapor deposition (LPCVD). The liner 206 may include any dielectric material such as silicon nitride (SiN), oxide, silicon boron carbon nitride (SiBCN), silicon oxide carbon nitride (SiOCN), aluminum oxide (AlOx), and may include a single layer or may include multiple layers of dielectric material. The liner 206 may have a thickness ranging from about 5 nm to about 20 nm. The liner 206 can be formed using any deposition technique including, for example, thermal oxidation, wet anodization, chemical vapor deposition (CVD), physical vapor deposition (PVD) and oxidation techniques. In an embodiment, the insulator 204 may be an oxide and the liner 206 may be silicon nitride.

The formation of the trench 208, may be formed by stopping on etching a portion of the substrate 102 for subsequent formation of a shallow trench isolation region (hereinafter "STI"). The trench 208 may be formed by an anisotropic etching technique, such as, for example, reactive ion etching (RIE). A lowermost surface of the trench 208 may be below the lower surface of the insulator 204. The anisotropic etching may remove aligned vertical portions of the liner 206, the insulator 204 and the substrate 202. The trench 208 may have a depth ranging from about 20 nm to about 100 nm.

The trench 208 is formed on the substrate 202 and may be formed wider and deeper than a trench formed for a traditional STI which is formed on a substrate which already has multiple nanosheet layers. The reduced amount of processing with has been already performed on the substrate 202 allows for a wider and deeper trench, allowing for an improved STI than a trench formed on a substrate with several layers of processing which must be protected.

Figure 5:
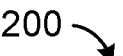
FIG. 5 illustrates a cross-sectional view of the second semiconductor structure along section line C-C, and illustrates forming a liner, according to an embodiment.
Figure 5:
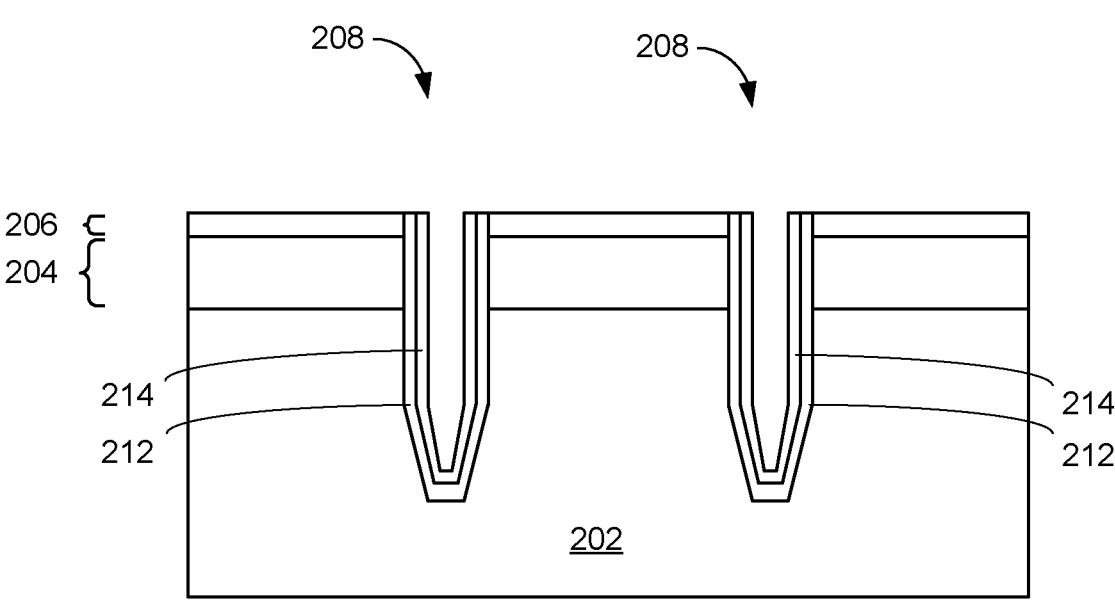

Referring now to FIG. 5, the structure 200 shown according to an exemplary embodiment. FIG. 5 is a cross-sectional view of the structure 200 along section line C-C. A liner 212 and a liner 214 may be formed.

The liner 212 may be formed conformally on the structure 200 on an upper horizontal surface of the liner 206 and may conformally line vertical side surfaces and horizontal surfaces of the trench 208. The liner 212 may be formed after several processes, including for example, conformally depositing or growing a dielectric and performing an anisotropic etch process. The liner 212 may include any dielectric material such as silicon oxide ($SiO_2$), silicon nitride (SiN), silicon boron carbon nitride (SiBCN), silicon oxide carbon nitride (SiOCN), aluminum oxide (AlOx), and may include a single layer or may include multiple layers of dielectric material. The liner 212 may each have a thickness ranging from about 1 nm to about 5 nm.

The liner 214 may be formed conformally on the structure 200 on the liner 212 and may conformally line vertical side surfaces and horizontal surfaces of the trench 208. The liner 214 may be formed conformally on the structure 200 after several processes, including for example, conformally depositing or growing a dielectric and performing an anisotropic etch process. The liner 214 may include any dielectric material such as silicon nitride (SiN), silicon boron carbon nitride (SiBCN), silicon oxide carbon nitride (SiOCN), aluminum oxide (AlOx), and may include a single layer or may include multiple layers of dielectric material. The liner 214 may conformally line vertical side surfaces and horizontal surfaces of the trench 208. The liner 214 may each have a thickness ranging from about 1 nm to about 5 nm.

In an embodiment, the liner 212 may be silicon oxide ($SiO_2$) and the liner 214 may be silicon nitride.

Portions of the liner 212 and portions of the liner 214 may be selectively removed from an upper surface of the liner 206 using known process techniques, exposing the upper horizontal surface of the liner 206, while remaining in the trench 208.

Figure 6:
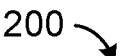
FIG. 6 illustrates a cross-sectional view of the second semiconductor structure along section line C-C, and illustrates forming a shallow trench isolation region, according to an embodiment.
Figure 6:
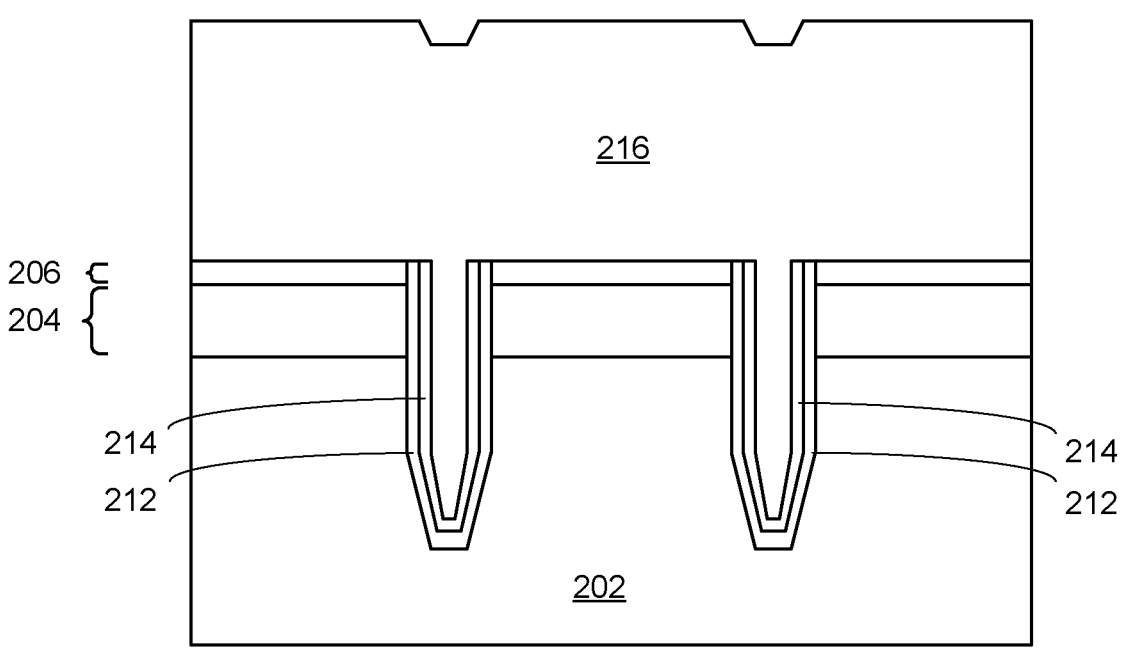

Referring now to FIG. 6, the structure 200 shown according to an exemplary embodiment. FIG. 6 is a cross-sectional view of the structure 200 along section line C-C. A shallow trench isolation region (hereinafter "STI") 216 may be formed.

The STI 216 is formed on the structure 200, on the upper horizontal surface of the liner 214 and completely fill the trench 208. The STI 216 may be a dielectric material and may be formed using known deposition, planarization and etching techniques. A lower horizontal surface and a portion of a vertical side surface of the STI 130 may be adjacent to a lower horizontal surface and a vertical side surface of the substrate 102. The lower horizontal surface of the STI 120 may be below a lower horizontal surface of the insulator 204. The STI 216 may fill remaining portions of the trench 208, within the liner 214 which is within the liner 212.

The STI 216 may include any dielectric material such as silicon oxide ($SiO_2$), silicon nitride (SiN), silicon boron carbon nitride (SiBCN), silicon oxide carbon nitride (SiOCN), aluminum oxide (AlOx), and may include a single layer or may include multiple layers of dielectric material. The STI 216 may be formed, by example, by chemical vapor deposition (CVD), atomic layer deposition (ALD), or spin on techniques. A densification anneal may be applied to the structure 200. In an embodiment, the anneal may be 1050° C. for 1 hour. In an embodiment, the STI 216 may be silicon oxide ($SiO_2$).

Figure 7:
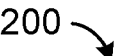
FIG. 7 illustrates a cross-sectional view of the second semiconductor structure along section line C-C, and illustrates removal of excess material, according to an embodiment.
Figure 7:
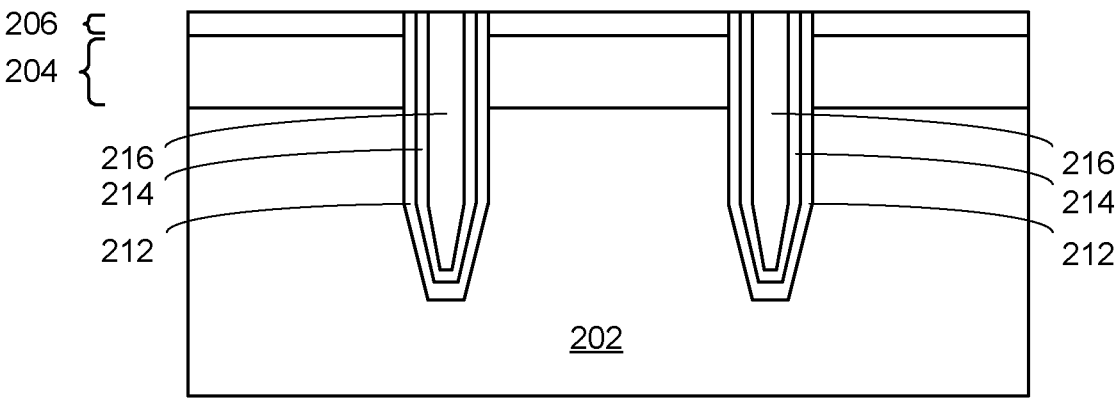

Referring now to FIG. 7, the structure 200 shown according to an exemplary embodiment. FIG. 7 is a cross-sectional view of the structure 200 along section line C-C.

A chemical mechanical polishing (CMP) technique may be used to remove excess material and polish upper surfaces of the structure 200, exposing a horizontal upper surface of the liner 206, a horizontal upper surface of the STI 216, a horizontal upper surface of the liner 214 and an upper horizontal surface of the STI 216, all within the trench 208.

Figure 8:
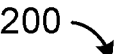
FIG. 8 illustrates a cross-sectional view of the second semiconductor structure along section line C-C, and illustrates forming a dielectric layer, according to an embodiment.
Figure 8:
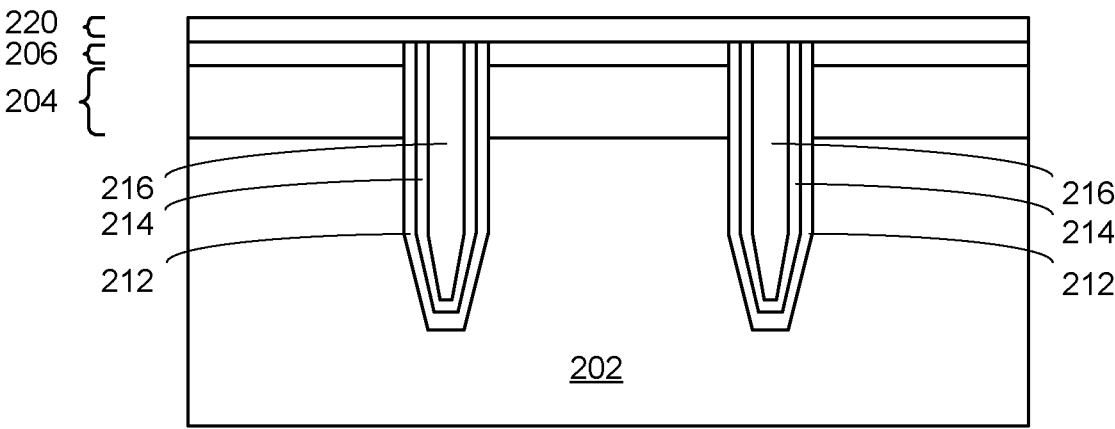

Referring now to FIG. 8, the structure 200 shown according to an exemplary embodiment. FIG. 8 is a cross-sectional view of the structure 200 along section line C-C. A dielectric layer 220 may be formed.

The dielectric layer 220 is deposited on the structure 200 on the horizontal upper surface of the liner 206, the horizontal upper surface of the STI 216, the horizontal upper surface of the liner 214 and the upper horizontal surface of the STI 216.

The dielectric layer 220 may also be referred to as an oxide layer. Non-limiting examples of materials for the dielectric layer 220 may include tetraethylorthosilicate (TEOS) oxide, silicon dioxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The dielectric layer 220 may have a thickness in a range from about 10 nm to about 200 nm, or from about 20 nm to about 100 nm.

Figure 9:
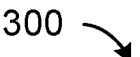
FIG. 9 illustrates a top view of a third semiconductor structure at an intermediate stage of fabrication, according to an exemplary embodiment.
Figure 9:
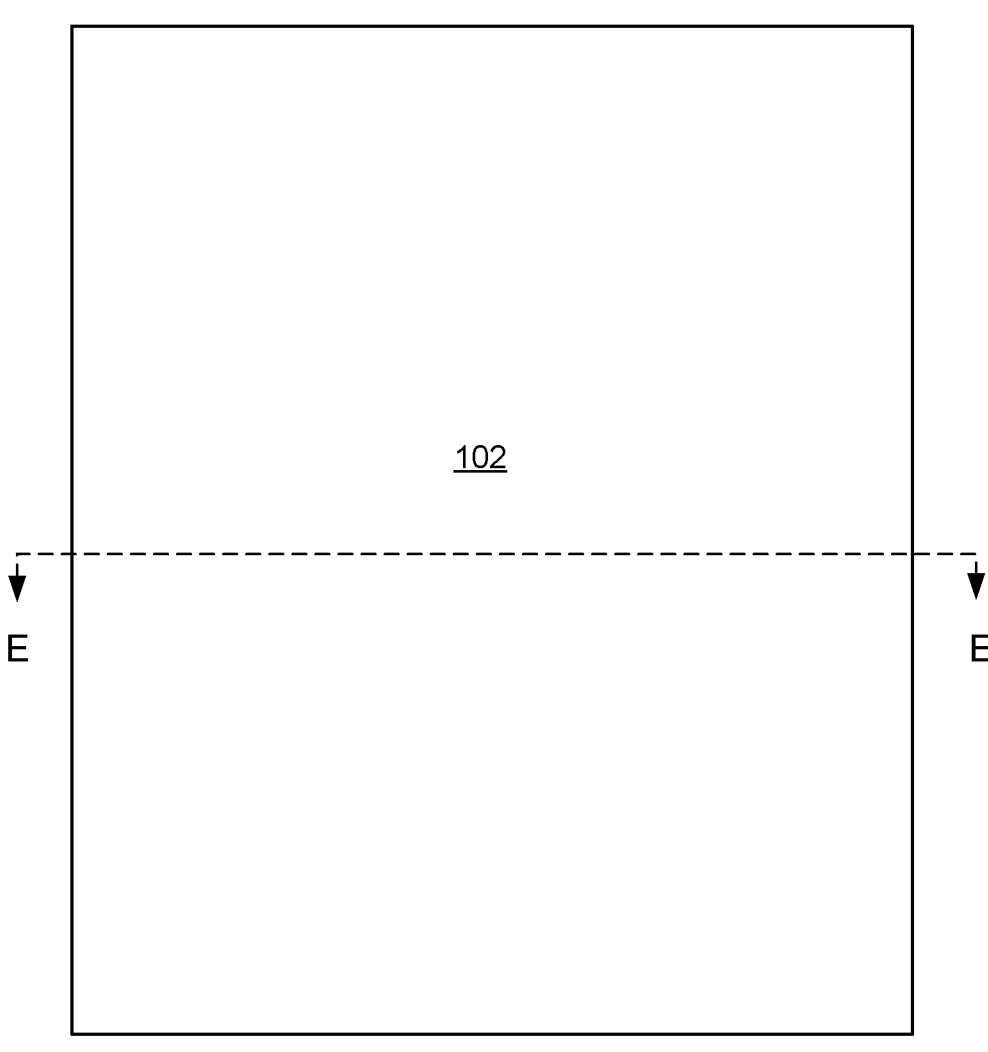
Figure 10:
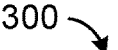
FIG. 10 illustrates a cross-sectional view of the third semiconductor structure of FIG. 9 along section line E-E, according to an exemplary embodiment.

Referring now to FIGS. 9 and 10, a semiconductor structure 300 (hereinafter "structure") is shown according to an exemplary embodiment. FIG. 9 is a top view of the structure 300. FIG. 10 is a cross-sectional view of the structure 300 along section line E-E. The structure 300 is formed by combining the structure 100 and the structure 200.

The structure 100 may be flipped over such that the substrate 102 is above the nanosheet structure. The flipped structure 100 may be mounted onto an upper surface of the structure 200. The dielectric capping layer 114 of the structure 100 may be bonded to the dielectric layer 220 of the structure 200. In an embodiment, the dielectric capping layer 114 and the dielectric layer 220 may be formed of the same material, for example TEOS. The structure 100 and the structure 200 may be bonded followed by removal of portions of the substrate 102.

The resulting structure has the substrate 102 above the upper nanosheet stack above the stack sacrificial layer 112 above the lower nanosheet stack above the dielectric layer 220.

Figure 11:
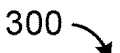
FIG. 11 illustrates a cross-sectional view of the third semiconductor structure along section line E-E, and illustrates removal of excess material, according to an exemplary embodiment.

Referring now to FIG. 11, the structure 300 is shown according to an exemplary embodiment. FIG. 11 is a cross-sectional view of the structure 300 along section line E-E. A portion of the substrate 102 may be removed.

A combination wet/dry etch or a chemical mechanical polishing (CMP) technique may be used to remove excess material and polish upper surfaces of the structure 300, removing a portion of the substrate 102.

Figure 12:
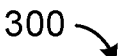
FIG. 12 illustrates a cross-sectional view of the third semiconductor structure along section line E-E, and illustrates formation of an insulator and a liner, according to an exemplary embodiment.

Referring now to FIG. 12, the structure 300 is shown according to an exemplary embodiment. FIG. 12 is a cross-sectional view of the structure 300 along section line E-E. An insulator 302 and a liner 304 may be formed.

The insulator 302 may be formed conformally on the substrate 102. The insulator 302 may be formed as described for the insulator 204. The insulator 302 may have a thickness ranging from about 5 nm to about 20 nm.

The liner 304 may be formed conformally on the insulator 302. The liner 304 may be formed as described for the liner 206. The liner 304 may have a thickness ranging from about 5 nm to about 10 nm. In an embodiment, the insulator 302 may be an oxide and the liner 304 may be silicon nitride.

Figure 13:
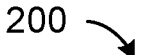
FIG. 13 illustrates a top view of the third semiconductor structure, and illustrates removal of select portions of layers, according to an exemplary embodiment.
Figure 13:
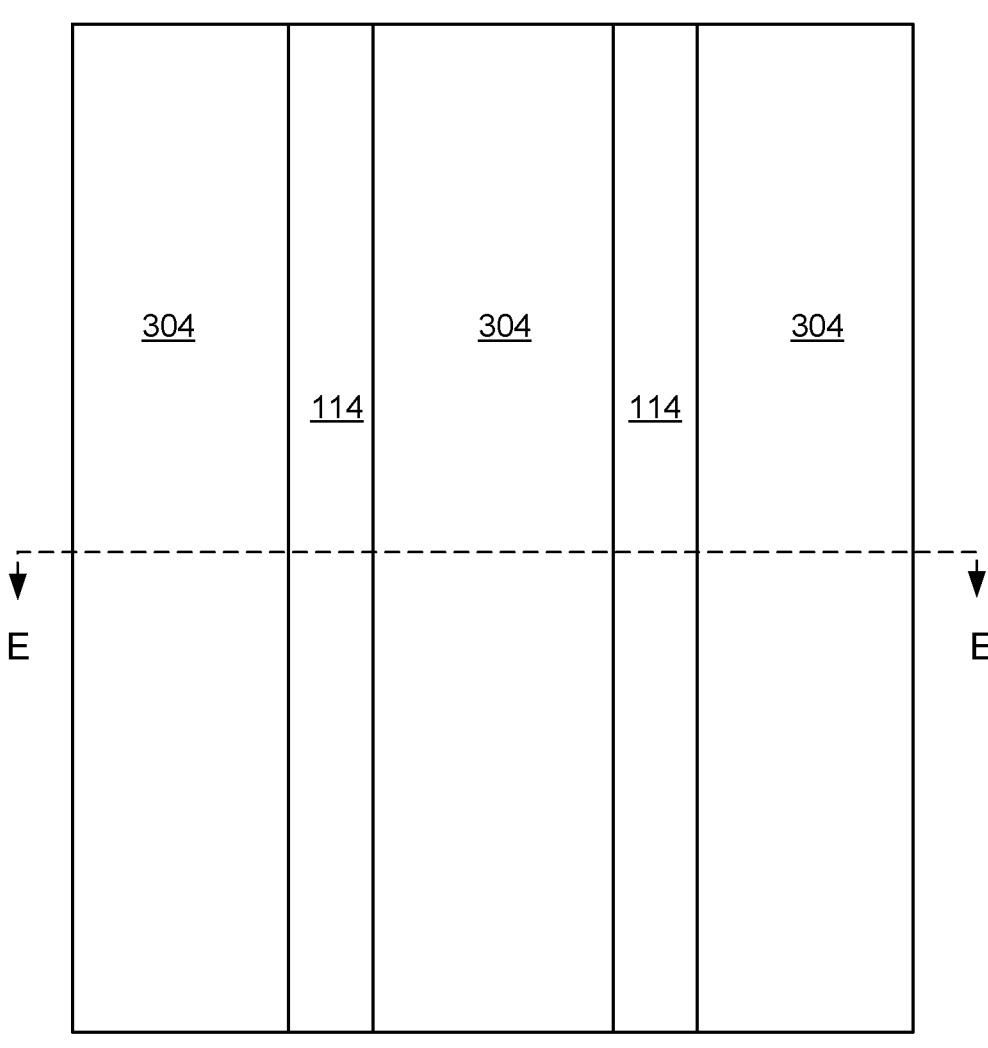
Figure 14:
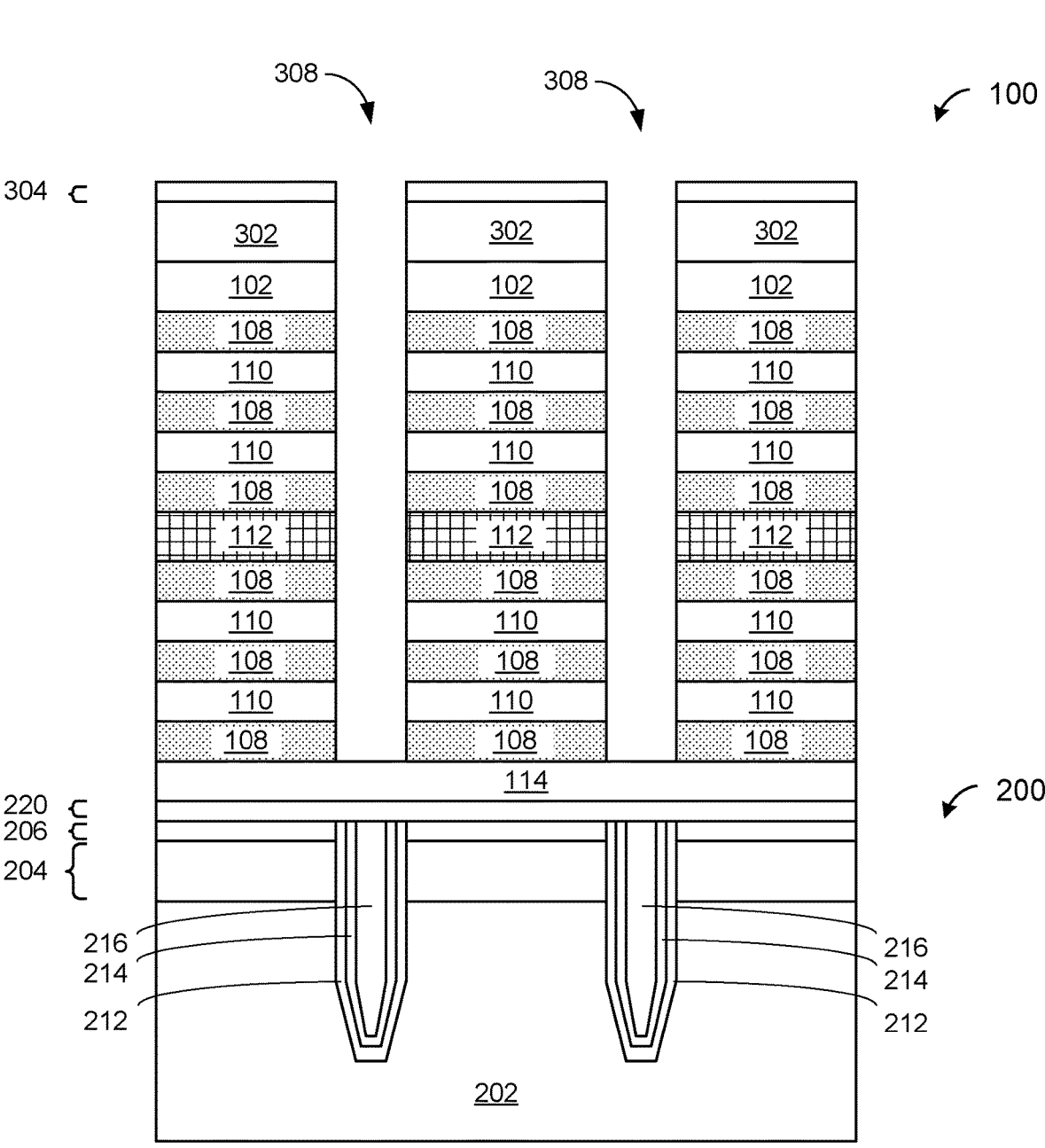
FIG. 14 illustrates a cross-sectional view of the third semiconductor structure of FIG. 13, along section line E-E, according to an exemplary embodiment.

Referring now to FIGS. 13 and 14, the structure 300 is shown according to an exemplary embodiment. FIG. 13 is a top view of the structure 300. FIG. 14 is a cross-sectional view of the structure 300 along section line E-E.

The alternating layers of sacrificial layers 108, channel layers 110 and stack sacrificial layer 112 may be formed into nanosheet stacks, by methods known in the art. The nanosheet stacks may have a length perpendicular to section line E-E. The nanosheet stacks may be formed by methods known in the arts, and include steps such as forming a hard mask, such as the liner 304, on the alternating layers, patterning the hard mask, or the liner 304, and subsequent formation of one or more trenches 308, by removal of portions of each layer of the stacked nanosheet. The trench 308 may be formed between each nanosheet stack by an anisotropic etching technique, such as, for example, reactive ion etching (RIE), and stopping on etching a portion of the dielectric capping layer 114 between each nanosheet stack. The trench 308 may be vertically aligned with the STI 216, where the STI 216 may provide physical and electrical isolation between adjacent nanosheet stacks.

Each nanosheet stack may include an upper nanosheet stack above the stack sacrificial layer 112, above the lower nanosheet stack. The upper nanosheet stack may include a sacrificial layer 108, covered by a channel layer 110, covered by a sacrificial layer 108, covered by a channel layer 110, covered by a sacrificial layer 108. The lower nanosheet stack may include a sacrificial layer 108, covered by a channel layer 110, covered by a sacrificial layer 108, covered by a channel layer 110, covered by a sacrificial layer 108.

The material stacks that can be employed in embodiments of the present invention are not limited to the specific embodiment illustrated in FIG. 14. In FIG. 14, and only by way of an example, the lower nanosheet stack includes three layers of sacrificial layers 108 alternating with two channel layers 110, and the upper nanosheet stack includes three layers of sacrificial layers 108 alternating with two channel layers 110. The lower nanosheet stack may be separated from the upper nanosheet stack by the stack sacrificial layer 112.

The lower nanosheet stack and the upper nanosheet stack each can include any number of sacrificial layers 108 and channel layers 110. The nanosheet stack is used to produce a gate all around device that includes vertically stacked semiconductor channel material nanosheets for a pair of stacked p-FETs or a pair of stacked n-FETs, or a p-FET stacked on an n-FET or an n-FET stacked on a p-FET.

By forming the STI 216 on the structure 200, and then combing the structure 200 and the structure 100 which contains the nanosheet layers, there is no need for subjecting the nanosheet layers to the process steps required to form the STI 216.

Figure 15:
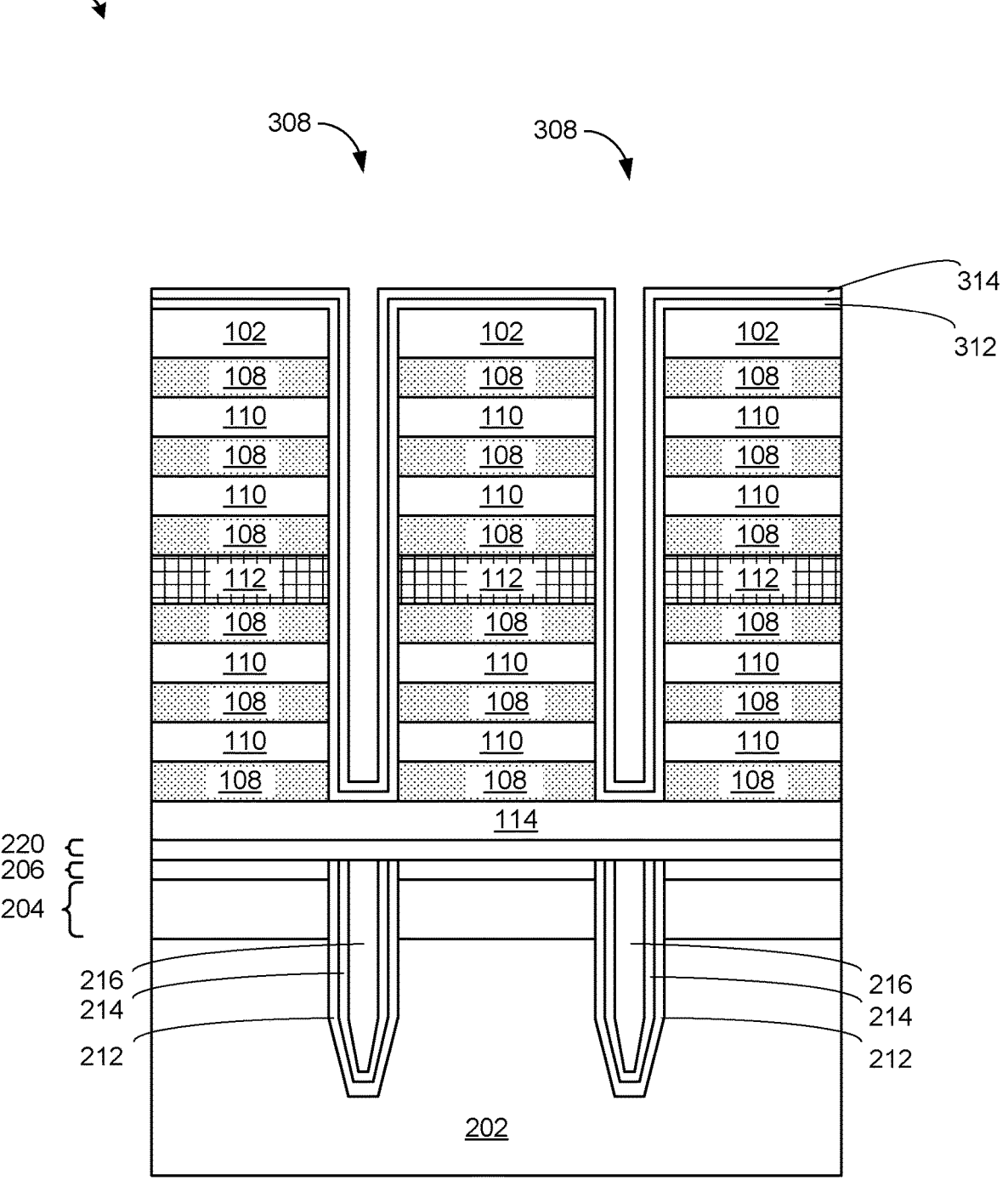
FIG. 15 illustrates a cross-sectional view of the third semiconductor structure along section line E-E, and illustrates removal of a liner and formation of a liner, according to an exemplary embodiment.

Referring now to FIG. 15, the structure 300 is shown according to an exemplary embodiment. FIG. 15 is a cross-sectional view of the structure 300 along section line E-E. The liner 304 and the insulator 302 may be removed. A dielectric layer 312 and a liner 314 may be formed.

The liner 304 and the insulator 302 may be removed by methods known in the arts.

The dielectric layer 312 may be formed conformally on the structure 300 on an upper horizontal surface and vertical side surfaces of the substrate 102 and may conformally line vertical side surfaces and horizontal surfaces of the trench 308, along vertical side surfaces of the channel layers 110, the sacrificial layers 108, the stack sacrificial layer 112, and an upper horizontal surface of the dielectric capping layer 114. The dielectric layer 312 may be formed as described for the liner 212. The dielectric layer 312 may each have a thickness ranging from about 1 nm to about 5 nm.

The liner 314 may be formed conformally on the structure 300 on the dielectric layer 312 and may conformally line vertical side surfaces and horizontal surfaces of the trench 308. The liner 314 may be formed as described for the liner 214. The liner 314 may each have a thickness ranging from about 1 nm to about 5 nm.

In an embodiment, the dielectric layer 312 may be silicon oxide ($SiO_2$) and the liner 314 may be silicon nitride.

Figure 16:
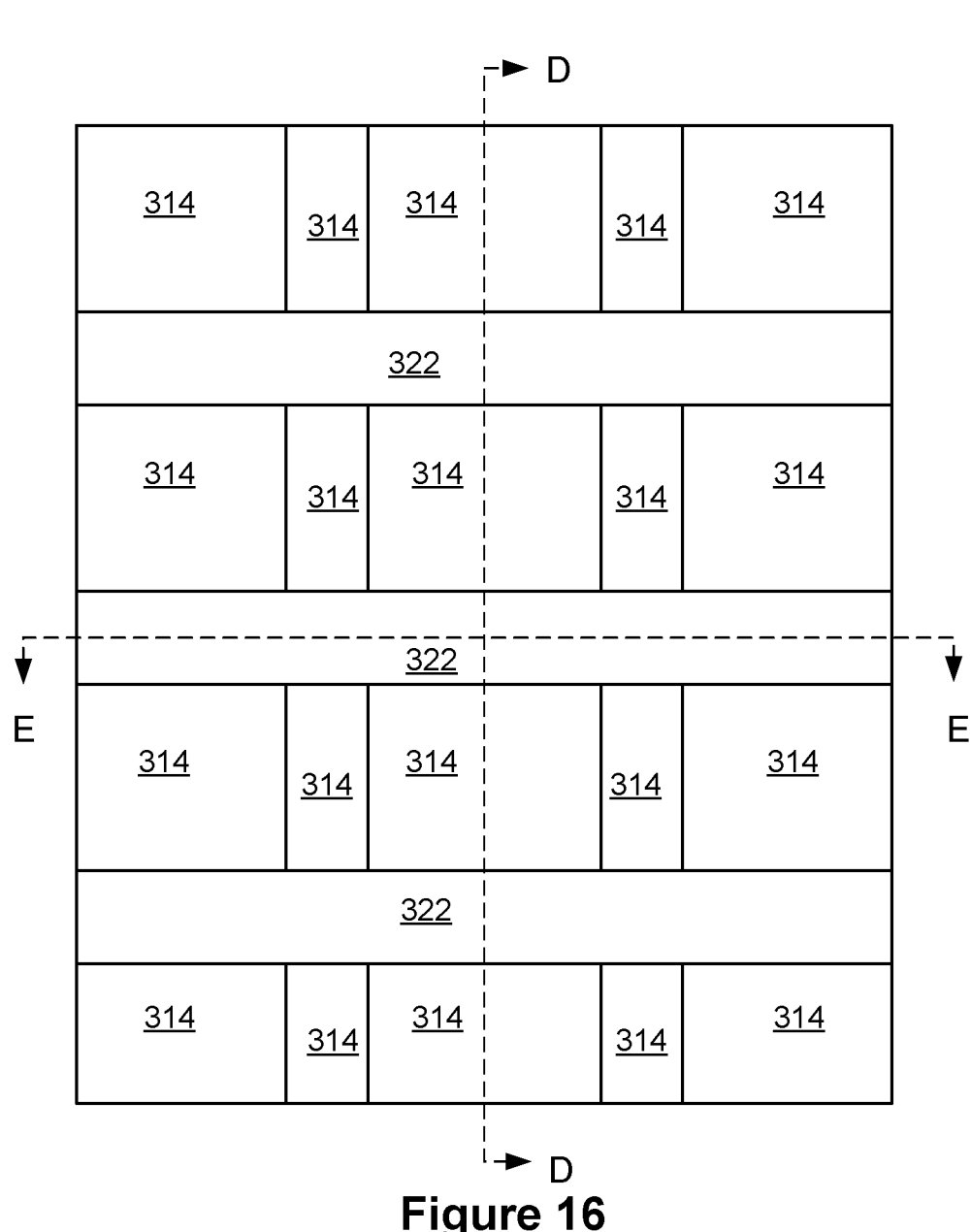
FIG. 16 illustrates a top view of the third semiconductor structure, and illustrates formation of a sacrificial gate, according to an exemplary embodiment.
Figure 17:
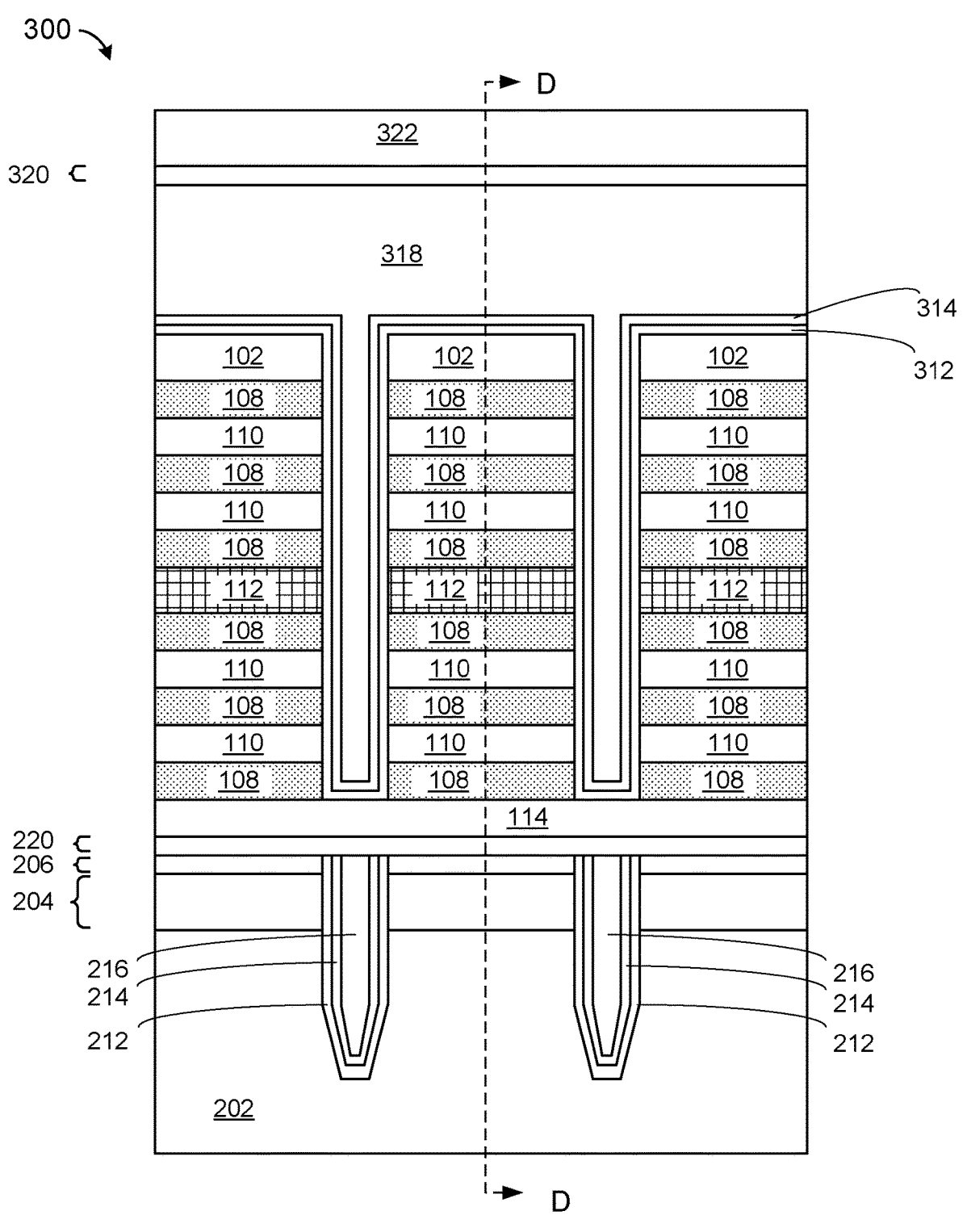
FIG. 17 illustrates a cross-sectional view of the third semiconductor structure of FIG. 16, along section line E-E, according to an exemplary embodiment.

Referring now to FIGS. 16 and 17, the structure 300 is shown according to an exemplary embodiment. FIG. 16 is a top view of the structure 300. FIG. 17 is a cross-sectional view of the structure 300 along section line E-E. A sacrificial gate 318, a gate dielectric layer 320 and a gate cap 322 may be formed.

The sacrificial gate 318, the gate dielectric layer 320 and the gate cap 322 are formed orthogonal (perpendicular) to the nanosheet stacks. By way of illustration, three sacrificial gates 318 are depicted in the drawings of the present application. The sacrificial gate 318 may include a single sacrificial material or a stack of two or more sacrificial materials. The at least one sacrificial material can be formed by forming a blanket layer (or layers) of a material (or various materials) and then patterning the material (or various materials) by lithography and an etch. The sacrificial gate 318 can include any material including, for example, polysilicon, amorphous silicon, or multilayered combinations thereof. The sacrificial gate 318 can be formed using any deposition technique including, for example, chemical vapor deposition (CVD), physical vapor deposition (PVD), high density plasma (HDP) deposition, and spin on techniques. Optionally, the gate dielectric layer 320 and the gate cap 322 may be formed as part of the sacrificial gate 318 in accordance with known techniques.

In an embodiment, the sacrificial gate 318 is deposited with a thickness sufficient to fill, or substantially fill, the spaces between adjacent nanosheet structures and cover a horizontal upper surface of the dielectric capping layer 114. The sacrificial gate 318 may be adjacent to vertical side surfaces of the nanosheet stack, including the lower nanosheet stack, the upper nanosheet stack and the stack sacrificial layer 112. The sacrificial gate 318 may cover an upper horizontal surface of the substrate 102 above the nanosheet stack. A height of the sacrificial gate 318 may be much thicker than the underlying structure and may have a height between 100 nm and 150 nm about the nanosheet stack. The gate cap 322 may cover an upper horizontal surface and a vertical side surface of the gate dielectric layer 320 on the sacrificial gate 318.

Figure 18:
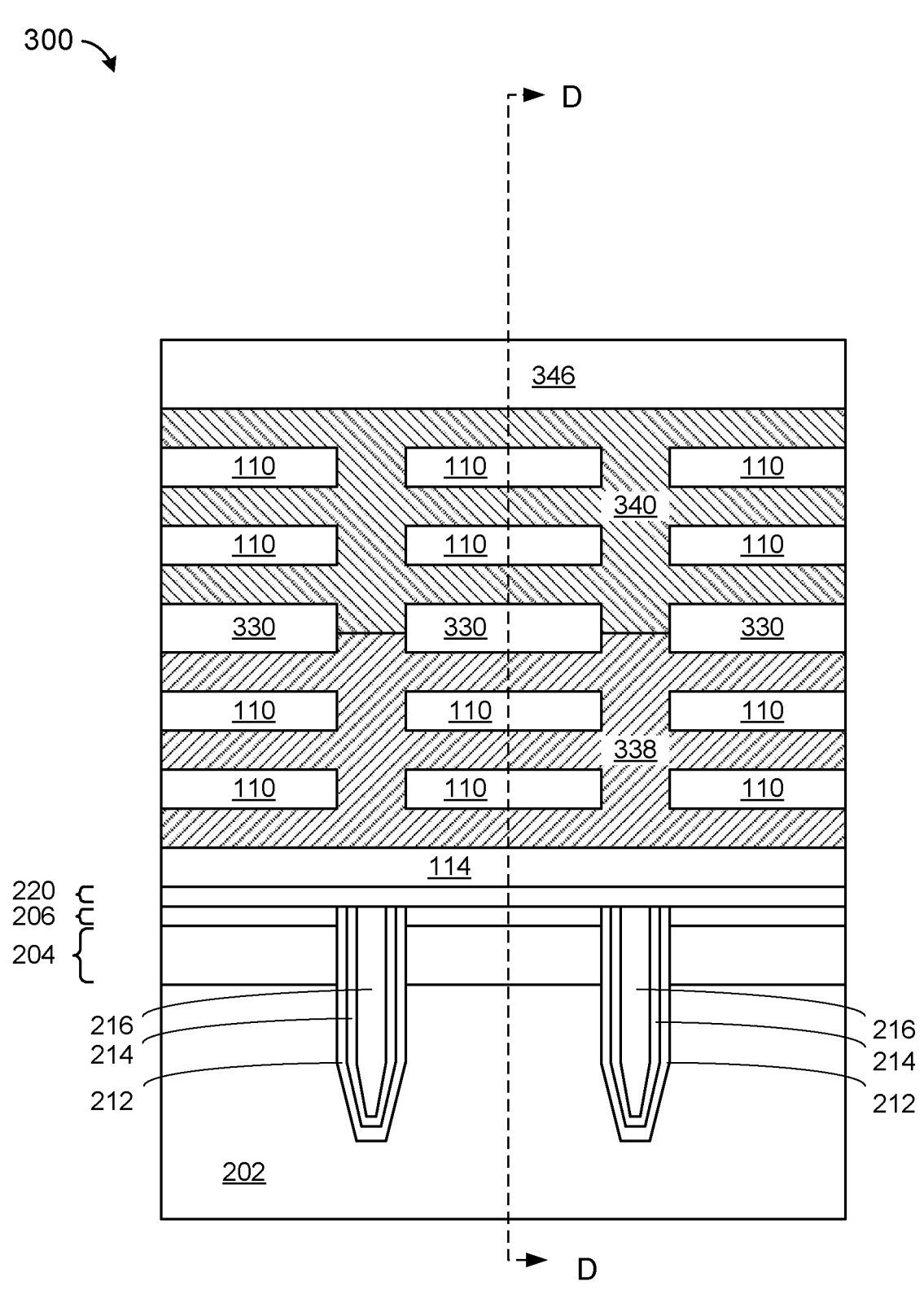
FIG. 18 illustrates a cross-sectional view of the third semiconductor structure along section line E-E, and illustrates multiple process steps, according to an exemplary embodiment.
Figure 19:
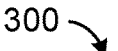
FIG. 19 illustrates a cross-sectional view of the third semiconductor structure along section line D-D, according to an exemplary embodiment.

Referring now to FIGS. 18 and 19, the structure 300 is shown according to an exemplary embodiment. FIG. 18 is a cross-sectional view of the structure 300 along section line E-E. FIG. 19 is a cross-sectional view of the structure 300 along section line D-D. Section line E-E is perpendicular to section line D-D. Several processing steps may be performed. The stack sacrificial layer 112 may be removed and a stack isolation region 330 may be formed. Portions of the sacrificial layers 108 may be removed and inner spacers 332 formed. A lower source drain 334, an inter-layer dielectric (hereinafter "ILD") 335 and an upper source drain 336 may be formed. An insulator 342 may be formed. A portion of the sacrificial gate 318, a portion of the gate dielectric layer 320 and a portion of the gate cap 322 may be removed. The sacrificial layers 108 may be removed. A first work function metal (hereinafter "first WFM") 338 and a second work function metal (hereinafter "second WFM") 340 may be formed. A dielectric capping layer 346 may be formed.

The stack sacrificial layer 112 may be selectively removed by methods known in the arts. For example, a dry etching technique can be used to selectively remove the stack sacrificial layer 112, such as, for example, using vapor phased HCl dry etch. The stack sacrificial layer 112 may be removed selective to the substrate 102, the channel layers 110, the sacrificial layers 108, the sacrificial gate 318, the gate dielectric layer 320, the gate cap 322, the dielectric capping layer 114, the dielectric layer 220, the liner 206, the insulator 204, the STI 216, the liner 214, the liner 212 and the substrate 202.

The stack isolation region 330 may be formed where the stack sacrificial layer 112 was removed. The stack isolation region 330 may be formed between the lower nanosheet stack and the upper nanosheet stack.

The stack isolation region 330 may be formed after several processes, including for example, conformally depositing or growing a dielectric and performing an anisotropic etch process. The stack isolation region 330 may include any dielectric material such as silicon nitride (SiN), silicon boron carbon nitride (SiBCN), silicon oxide carbon nitride (SiOCN), aluminum oxide (AlOx), and may include a single layer or may include multiple layers of dielectric material.

The stack isolation region 330 will help to provide insulation between the upper and lower nanosheet stacks which allows for later formation of different work function metals and associated high k liners for each, for each of the upper and lower nanosheet stacks.

Outer portions of the sacrificial layers 108 may be selectively removed using known techniques. For example, a wet or dry etch process can be used with the appropriate chemistry to remove portions of each of the sacrificial layers 108. The material used for the etching process may be selective such that the channel layers 110, the stack isolation region 330, the sacrificial gate 318, the gate dielectric layer 320, the gate cap 322, the substrate 102, the substrate 202, the STI 216, the liner 212, the liner 214, the dielectric layer 220, the liner 206, the insulator 204 and the dielectric capping layer 114 remain and are not etched. After etching, portions of the sacrificial layers 108 covered on opposite sides by the sacrificial gate 318 may remain as part of the nanosheet stack.

The inner spacer 332 may be formed by conformally depositing or growing a dielectric material, followed by a combination of dry and wet anisotropic etch and recessing steps. The inner spacer 332 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an anisotropic vertical etch process such as a reactive ion etch (RIE), or any suitable etch process. In an embodiment, the inner spacer 332 may include one or more layers. In an embodiment, the inner spacer 332 may include any dielectric material such as silicon oxide, silicon oxynitride, silicon nitride, SiBCN, SiOC, low-k dielectric or any combination of these materials. In an embodiment, the inner spacer 332 may be nitride. In an alternate embodiment, the inner spacer 332 may be oxide.

The inner spacer 332 may completely fill in spaces between the channel layers 110, between the upper most channel layer 110 and the sacrificial gate 318 and between the lowermost channel layer 110 and the dielectric capping layer 114, where the portions of the sacrificial layers 108 had been previously removed.

A vertical side surface of the inner spacer 332 may be aligned with a vertical side surface of the channel layers 108 and a vertical side surface of the gate cap 322.

A source drain trench (not shown) may be formed along the nanosheet stack. The source drain trench (not shown) may be formed by an anisotropic etching technique, such as, for example, reactive ion etching (RIE). A lowermost surface of the source drain trench (not shown) may be below the lower surface of the lowermost sacrificial layer 108. The anisotropic etching may remove aligned vertical portions of the stacked nanosheet stack between adjacent sacrificial gates 318, gate dielectric layer 320 and gate caps 322. The sacrificial gate 318, gate dielectric layer 320 and the gate cap 322 may protect remaining portions of the nanosheet stack. The vertical portion of the nanosheet stack may be recessed for subsequent formation of a source drain epitaxy in the source drain trench (not shown).

The lower source drain 334 may be epitaxially grown surrounding a vertical portion of the lower stack on opposite sides of the sacrificial gate 318. In this embodiment, the lower source drain 334 may surround the lower most two channel layers 110 and the lower most three sacrificial layers 108 with surrounding inner spacers 332 of the lower nanosheet stack. The lower source drain 334 may be adjacent to an exposed upper surface of the dielectric capping layer 114.

The ILD 335 may be formed by conformally depositing or growing a dielectric material, followed by a combination of dry and wet anisotropic etch and recessing steps. The ILD 335 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an anisotropic vertical etch process such as a reactive ion etch (RIE), or any suitable etch process. In an embodiment, the ILD 335 may include one or more layers. In an embodiment, the ILD 335 may include any dielectric material such as silicon oxide, silicon oxynitride, silicon nitride, SiBCN, SiOC, low-k dielectric or any combination of these materials. In an embodiment, the ILD 335 may be a nitride. In an alternate embodiment, the ILD 335 may be an oxide. The ILD 335 may surround the stack isolation region 330. A portion of the ILD 335 may be coplanar with an upper horizontal surface and a vertical surface of the lower source drain 334.

The upper source drain 336 may be epitaxially grown surrounding a vertical portion of the upper stack on opposite sides of the sacrificial gate 318. In this embodiment, the upper source drain 336 may surround the upper most two channel layers 110 and the upper most three sacrificial layers 108 with surrounding inner spacers 332 of the upper stack. The upper source drain 336 may be adjacent to an exposed upper surface of the ILD 335. An upper surface of the upper source drain 336 may be coplanar with an upper surface of the uppermost sacrificial layer 108 with surrounding inner spacers 332.

The ILD 335 may physically and electrically isolate the lower source drain 334 and the upper source drain 336, and physically and electrically isolate adjacent nanosheet stacks.

The insulator 342 may be formed on an exposure upper surface of the upper source drain 336. The insulator may be formed as described for the insulator 204.

A chemical mechanical polishing (CMP) technique may be used to remove excess material and polish upper surfaces of the structure 100, exposing an upper surface of the sacrificial gate 318. The sacrificial gate 318 may be removed by methods known in the arts. An upper surface of the uppermost sacrificial layer 108 may be exposed. A remaining portion of the substrate 102, the dielectric layer 312 and the liner 314 may remain above the nanosheet stack, covering outside an uppermost pair of inner spacers 332 surrounding the uppermost sacrificial layer 108.

The sacrificial layers 108 are removed selective to the channel layers 110, the inner spacers 332, the dielectric layer 312, the liner 314, the ILD 335, the stack isolation region 330, the upper source drain 336, the ILD 335, the lower source drain 334, the STI 216, the liner 214, the liner 212, the substrate 102, the substrate 202, the dielectric capping layer 114, the dielectric layer 220, the liner 206 and the insulator 204. For example, a dry etch process can be used to selectively remove the sacrificial layers 108, such as using vapor phased HCl dry etch.

The first WFM 338 may be conformally formed on the structure 100, according to an exemplary embodiment. The first WFM 338 is formed in each cavity of the nanosheet stack and surrounding suspended portions of the channel layers 110. The first WFM 338 forms a layer surrounding exposed portions of the nanosheet stacks. The first WFM 338 may cover an exposed upper horizontal surface of the dielectric capping layer 114, exposed vertical side surfaces of one side of the side spacers 332 and exposed vertical side surfaces of one side of the substrate 102, the dielectric layer 312 and the liner 314. The first WFM 338 may cover vertical side surfaces, an upper horizontal surface and a lower horizontal surface of the channel layers 110. The first WFM 338 may cover vertical side surfaces, an upper horizontal surface and a lower horizontal surface of the stack isolation region 330.

The first WFM 338 may be deposited using typical deposition techniques, for example, atomic layer deposition (ALD), molecular layer deposition (MLD), and chemical vapor deposition (CVD).

In an embodiment, the first WFM 338 may include more than one layer, for example, a conformal layer of a high-k material may be formed prior to the formation of the first WFM 338. The material chosen for the first WFM 338, and any high-k dielectric, may be selected based on whether the device is a p-FET or n-FET. In an embodiment, the work function metal of a p-FET device may include a metal nitride, for example, titanium nitride or tantalum nitride, titanium carbide titanium aluminum carbide, or other suitable materials known in the art. In an embodiment, the work function metal of an n-FET device may include, for example, titanium aluminum carbide or other suitable materials known in the art. In an embodiment, the work function metal may include one or more layers to achieve desired device characteristics. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof.

Known techniques may be used to selectively remove portions of the first WFM 338 such that a remaining portion of the first WFM 338 has an upper surface between the lower nanosheet stack and the upper nanosheet stack. In an embodiment, the upper surface of the first WFM 338 may align with a horizontal upper surface of the stack isolation regions 330. For example, a wet etching technique may be used to selectively remove portions of the first WFM 338 selective to the channel layers 110, the stack isolation region 330, the side spacers 332, the substrate 102, the substrate 202, the STI 216, the liner 214, the liner 212, the dielectric layer 220, the insulator 204, the liner 206, the lower source drain 334, the ILD 335, the upper source drain 336, the substrate 102, the dielectric layer 312 and the liner 314.

A remaining portion of the first WFM 338 remains surrounding the channel layers 110 of the lower nanosheet stack and between the inner spacers 332.

The second WFM 340 may be conformally formed on the structure 100, as described above for the first WFM 338. The second WFM 340 is formed in each exposed cavity of the nanosheet stack and surrounding suspended portions of the channel layers 110. The second WFM 340 forms a layer surrounding exposed portions of the nanosheet stacks. The second WFM 340 may cover exposed vertical side surfaces of one side of the side spacers 332 and exposed vertical side surfaces of one side of the substrate 102, the dielectric layer 312 and the liner 314, all of which are exposed above the first WFM 338. The second WFM 340 may cover vertical side surfaces, an upper horizontal surface and a lower horizontal surface of the channel layers 110 above the first WFM 338. The second WFM 340 may cover vertical side surfaces, an upper horizontal surface and a lower horizontal surface of the stack isolation region 330 above the first WFM 338.

As described above, the material chosen for the second WFM 340 in combination with other materials and properties as described above, may be selected based whether the device is a p-FET or n-FET. In an embodiment, the second WFM 340 may include more than one layer, for example, a conformal layer of a high-k material may be formed prior to the formation of the second WFM 340, also described above.

In an embodiment, the second WFM 340 may include more than one layer, for example, a conformal layer of a high-k material may be formed prior to the formation of the second WFM 340. The material chosen for the second WFM 340, and any high-k dielectric, may be selected based in combination with other materials and properties as described above, and whether the device is a p-FET or n-FET.

A dielectric capping layer 346 may be formed on an exposed upper surface of the second WFM 340. The dielectric capping layer 346 may be formed as described for the dielectric capping layer 114.

A chemical mechanical polishing (CMP) technique may be used to remove excess material and polish upper surfaces of the structure 300.

Contacts may be formed following known processes to the lower source drain 334, the upper source drain 336, the first WFM 338 and the second WFM 3402.

The structure 300 has been formed by combining stacked nanosheets formed on the structure 100, with the structure 200 which includes an already formed STI. Additional processing steps starting with the sacrificial gate formation may be performed on the combined substrate. Forming the STI on the second substrate may allow for a larger and improved thick insulator material to help isolate electrically and physically adjacent nanosheet devices and isolation reduces leakage characteristics between adjacent nanosheet devices. The stacked nanosheets will not be exposed to processing steps required for forming an STI which would otherwise be formed on the same substrate of the structure 100.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
a first nanosheet stack and a second nanosheet stack on a substrate, wherein the first nanosheet stack and the second nanosheet stack each comprise:
   a lower nanosheet stack comprising alternating layers of a first work function metal and a semiconductor channel material vertically aligned and stacked one on top of another; and
   an upper nanosheet stack comprising alternating layers of a second work function metal and the semiconductor channel material vertically aligned and stacked one on top of another, the upper nanosheet stack vertically aligned and stacked on top of the lower nanosheet stack;
a shallow trench isolation region in the substrate, the shallow trench isolation region vertically aligned between the first nanosheet stack and the second nanosheet stack, the shallow trench isolation region having a liner on side and bottom surfaces;
a continuous dielectric layer below the first nanosheet stack, below the second nanosheet stack, and above and in direct contact with the shallow trench isolation region; and
a non-continuous dielectric layer below the continuous dielectric layer in direct contact with a side of the liner.

2. The semiconductor device according to claim 1, wherein the shallow trench isolation region is below a source drain between the first nanosheet stack and the second nanosheet stack.

3. The semiconductor device according to claim 1, further comprising:

a second continuous dielectric layer below the first nanosheet stack, below the second nanosheet stack and above the shallow trench isolation region.

4. The semiconductor device according to claim 1, further comprising:

a silicon dioxide ($SiO_2$) layer below the first nanosheet stack bonded to a second silicon dioxide ($SiO_2$) layer above the substrate.

5. The semiconductor device according to claim 1, further comprising:

an upper source drain region between the upper nanosheet stack of the first nanosheet stack and the upper nanosheet stack of the second nanosheet stack; and a lower source drain region between the lower nanosheet stack of the first nanosheet stack and the lower nanosheet stack of the second nanosheet stack.

6. The semiconductor device according to claim 5, further comprising:

an interlayer dielectric physically separating the upper source drain region and the lower source drain region.

7. A semiconductor device comprising:

a first nanosheet stack and a second nanosheet stack on a substrate, wherein the first nanosheet stack and the second nanosheet stack each comprise:

a lower nanosheet stack comprising alternating layers of a first work function metal and a semiconductor channel material vertically aligned and stacked one on top of another; and an upper nanosheet stack comprising alternating layers of a second work function metal and the semiconductor channel material vertically aligned and stacked one on top of another, the upper nanosheet stack vertically aligned and stacked on top of the lower nanosheet stack;

a shallow trench isolation region in the substrate, the shallow trench isolation region vertically aligned between the first nanosheet stack and the second nanosheet stack, the shallow trench isolation region having a liner on side and bottom surfaces;

a continuous dielectric layer below the first nanosheet stack, below the second nanosheet stack, and above and in direct contact with the shallow trench isolation region; and a non-continuous dielectric layer below the continuous dielectric layer in direct contact with a side of the liner, wherein the shallow trench isolation region is below a source drain between the first nanosheet stack and the second nanosheet stack.

8. The semiconductor device according to claim 7, wherein a second continuous dielectric layer below the first nanosheet stack, below the second nanosheet stack and above the shallow trench isolation region.

9. The semiconductor device according to claim 7, further comprising:

a silicon dioxide ($SiO_2$) layer below the first nanosheet stack bonded to a second silicon dioxide ($SiO_2$) layer above the substrate.

10. The semiconductor device according to claim 7, further comprising:

an upper source drain region between the upper nanosheet stack of the first nanosheet stack and the upper nanosheet stack of the second nanosheet stack; and a lower source drain region between the lower nanosheet stack of the first nanosheet stack and the lower nanosheet stack of the second nanosheet stack.

11. The semiconductor device according to claim 10, further comprising:

an interlayer dielectric physically separating the upper source drain region and the lower source drain region.

* * * * *